United States Patent [19]

Sugishima et al.

[11] Patent Number: 4,678,919
[45] Date of Patent: Jul. 7, 1987

[54] ELECTRON BEAM EXPOSURE METHOD AND APPARATUS

[75] Inventors: Kenji Sugishima, Kawasaki; Kenji Nakagawa, Isehara, both of Japan

[73] Assignee: Fujitsu Limited, Kanagawa, Japan

[21] Appl. No.: 883,425

[22] Filed: Jul. 14, 1986

Related U.S. Application Data

[63] Continuation of Ser. No. 574,726, Jan. 27, 1984, abandoned.

[30] Foreign Application Priority Data

Jan. 31, 1983 [JP] Japan ................................ 58-014086

[51] Int. Cl.$^4$ ............................................. H01J 37/24
[52] U.S. Cl. .................. 250/491.1; 250/492.2
[58] Field of Search .................. 250/492.2, 492.3, 398, 250/491.1, 492.22

[56] References Cited

U.S. PATENT DOCUMENTS

| | | | |
|---|---|---|---|
| 4,119,854 | 10/1978 | Tanaka et al. ................... | 250/492.2 |
| 4,137,459 | 1/1979 | Albrecht et al. ................. | 250/492.2 |
| 4,390,788 | 6/1983 | Hayashi et al. .................. | 250/492.2 |
| 4,443,704 | 4/1984 | Yamashita et al. .............. | 250/492.2 |

OTHER PUBLICATIONS

H. Smith, "Fabrication Techniques for Surface-Acoustic-Wave and Thin-Film Optical Devices," Proceedings of the IEEE, vol. 62, No. 10, Oct. 1974, pp. 1361-1387.

H. R. Rottmann: "Advances in Contact and Proximity Printing", Kodak Microelectronics Seminar, Proceedings of Interface '74.

Distortion Correction and Deflection Calibration by Means of Laser Interferometry in an Electron Beam Exposure System; Asai et al, J. Vac. Sci. Tech., Nov./Dec. 79.

*Primary Examiner*—Bruce C. Anderson
*Assistant Examiner*—Paul A. Guss
*Attorney, Agent, or Firm*—Staas & Halsey

[57] ABSTRACT

An electron beam exposure system for producing a desired pattern on a workpiece. The pattern is specified by predetermined pattern data. The pattern data is modified with correction data. The correction data is obtained from information indicating variations on the level of the surface of the workpiece due to an elastic deformation thereof during the exposure process. With the use of the correction data, the desired pattern is correctly reproduced as intended when the workpiece is fully supported and the surface thereof recovers its flatness.

10 Claims, 11 Drawing Figures

ELECTRON BEAM EXPOSURE METHOD AND APPARATUS

This is a continuation of co-pending application Ser. No. 574,726 filed on Jan. 27, 1984 now abandoned.

BACKGROUND OF THE INVENTION

1. Field of the Invention

The present invention relates to the fabrication of semiconductor devices, especially very large scale integration (VLSI) devices. More particularly, it relates to a method and apparatus for patterning workpieces for producing such devices with a high degree of accuracy.

2. Description of the Prior Art

Recent research and development in semiconductor devices has concentrated on a higher degree of miniaturization and higher packaging densities. Such miniaturization and high density packaging of patterns can be realized by compound techniques such as patterning resists and etching the surfaces of the semiconductor substrates, and using the patterned resists as masks.

Among these techniques, patterning can be achieved very precisely, i.e., to a limit of less than 0.2 $\mu$m, by employing an electron beam exposure system now in practical use. This electron beam exposure system has the following advantages. First, very precise patterning can be obtained with a minimum line width of about 0.1 $\mu$m, giving a higher resolution than that of light. Second, since it is possible to establish a very high positioning accuracy when a step and repeat method is used, each two adjacent subpatterns and each two adjacent strips can be finely aligned with each other. Third, because of the above second advantage, a plurality of subpatterns can be accurately set up to obtain a considerably large size pattern. Fourth, the input data for defining each pattern can be easily adapted to computer processing. Fifth, the number of steps can be reduced below those needed in a light exposure system, thus minimizing the time required for making each device. Further, the electron beam exposure system itself can also work as a pattern generating system.

Note, in view of the above advantages, the electron beam exposure system is used during the manufacture of the devices for dealing with a variety of workpieces, such as a reticle, a master mask, a wafer, and the like. The workpiece is usually supported at three or more points on the bottom thereof, to maintain the workpiece in a position which is horizontal relative to the incident electron beam. In practice, however, this horizontal relation cannot be strictly maintained. This is because the surface of the work piece is slightly deformed, i.e., is not truly flat due to its own weight. The areas of the surface just above the supporting points can maintain the desired height, but areas apart from the supporting points necessarily drop to a level lower than that desired. Thus, elastic deformation by compression and/or elastic deformation by tension are created on the surface of the workpiece to be patterned by the electron beam. Such elastic deformations result in pattern pitch errors, and thereby, produce undesirable pattern distortion.

The pitch errors may be caused by elastic deformation of the workpiece, nontrue flatness of the surface on which the workpiece is supported at the points, and nonuniformity of the thickness of the workpiece. Conventionally, small pitch errors, i.e., smaller than about 0.5 $\mu$m, cause little or no problem, and therefore, such small pitch errors are disregarded. However, in VLSI devices, even pitch errors of about 0.5 $\mu$m cannot be permitted, and a higher positioning accuracy is demanded in order to attain a further miniaturization and a denser packaging of the integrated circuit (IC) patterns. Accordingly, the permissible error for positioning accuracy now becomes very limited and, for example, a pitch error of about 0.1 $\mu$m, at least, must be satisfied.

Among the above-mentioned causes of pitch errors, the present invention refers mainly to the elastic deformation of the workpiece. The remaining factors, i.e., the flatness and uniformity of thickness of the workpiece, may be easily improved by known techniques.

SUMMARY OF THE INVENTION

It is an object of the present invention to provide an electron beam exposure method and apparatus for compensating for the pitch errors caused by the elastic deformation of the workpiece.

The above object is attained by, first, obtaining precise level data of the elastically deformed surface of the workpiece to be patterned by the electron beam, and second, by applying correction data to predetermined pattern data, the predetermined pattern data initially intended to form a desired pattern, a flat surface. This correction data is derived from the level data, and the elastically deformed surface is exposed to the electron beam under the control of the corrected pattern data.

BRIEF DESCRIPTION OF THE DRAWINGS

The present invention will be more apparent from the following description with reference to the accompanying drawings, wherein.

DESCRIPTION OF THE PREFERRED EMBODIMENTS

Figure 1:
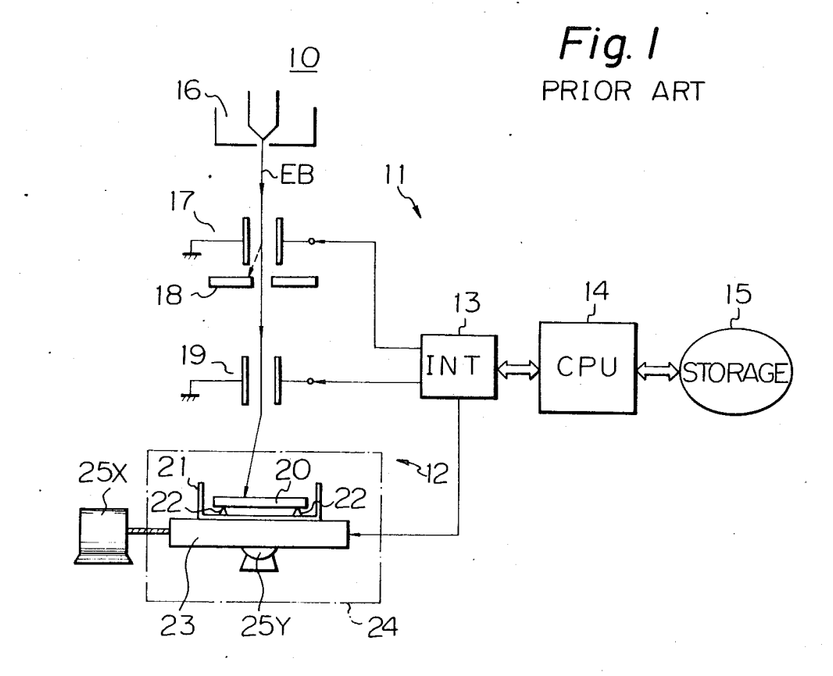
FIG. 1 is an overall schematic view of a conventional electron beam exposure system.

FIG. 1 illustrates an overall schematic view of a conventional electron beam exposure system. The electron beam exposure system 10 in FIG. 1 usually comprises two major parts, i.e., a processor 11 and an exposure assembly 12. The processor 11 is comprised of an interface equipment 13, a central processing unit 14, and a storage unit 15. The basic assembly of the exposure assembly 12 is as follows.

An electron beam source 16 which radiates an electron beam EB. This EB is injected into a blanking unit 17 cooperating with a blanking plate 18 provided with an aperture therein. The function of the blanking unit 17 is to permit or not to permit the EB to travel downward. The EB passing through the unit 17 is controlled by a deflection unit 19 so as to travel along a specified flying path, in accordance with a pattern data stored in the storage unit 15. The incident EB is applied to the surface of a workpiece 20. The workpiece 20 is held by a piece holder 21 at three or more, usually four, supporting points 22. The workpiece 20, together with the piece holder 21, is mounted on a stage 23. The members 20 through 23 are located inside a work chamber 24. Since the incident angle of the EB is very small, e.g., several milliradians, the workpiece 20 is moved stepwise in an X axis direction and/or Y axis direction by an X axis drive motor 25X and a Y axis drive motor 25Y, to form the desired patterns on the entire surface of the workpiece 20 by the previously-mentioned step and repeat method.

The workpiece 20 may be, as previously mentioned, a reticle, a master mask, or a wafer. The present invention is described with reference to a master mask as a preferred example.

The master mask is made from a blank mask. The blank mask is made of glass plate 1.5 mm or 2.3 mm in thickness (or synthetic quartz) having a low coefficient of expansion. The glass plate is larger in length, at each side, than the semiconductor wafer, which has a diameter of about 100 mm. A metal chromium (Cr) layer, about 60 nm to 90 nm in thickness, is formed on the entire surface of the glass plate by a sputtering method. The electron-resist-coated material is then covered over the surface of the Cr layer. The thus formed blank mask is then placed in the work chamber 24 so that the desired patterns can be drawn with the EB, by concurrently using the step and repeat method, to obtain the master mask. This method is carried out with the aid of the X and Y axis drive motors 24X and 24Y, constructed as pulse motors, and the like. The motors are driven with a very high positioning accuracy of less than about 0.1 μm, by utilizing a suitable interferometer, for example, using an He-Ne laser.

Figure 2:
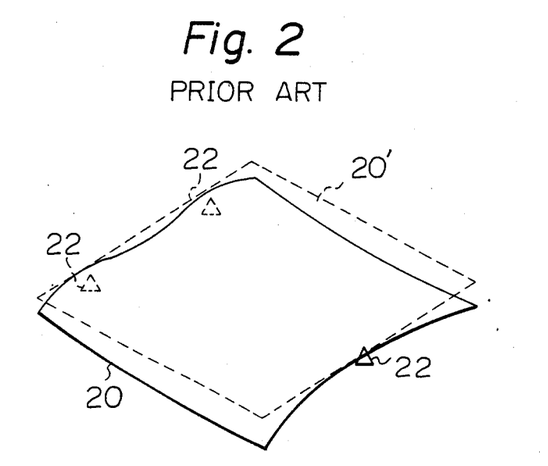
FIG. 2 is a perspective view of a blank mask to be patterned when supported at three points.

FIG. 2 is a perspective view of a blank mask, to be patterned, when supported at three points. The workpiece 20, i.e., the blank mask indicated by solid lines, represents an elastically deformed mask when supporting at three points 22. The blank mask 20', indicated by broken lines, represents a mask wherein no elastic deformation is exhibited. Note, the unevenness of the illustrated mask 20, caused by the elastic deformation, induces the previously-mentioned pitch error.

Figure 3:
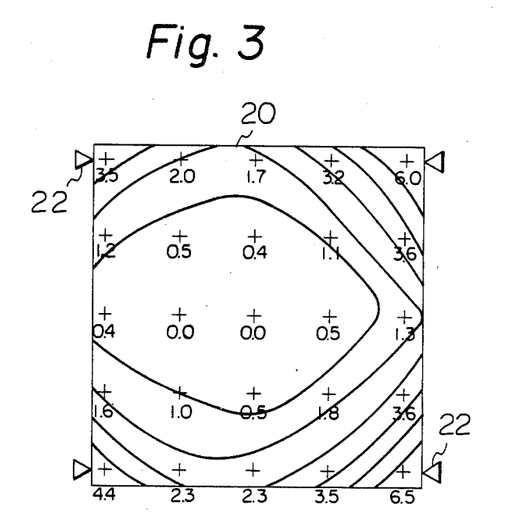
FIG. 3 is a plan view of the blank mask to be patterned when supported at four points.

FIG. 3 is a plan view of a blank mask, to be patterned, when supported at four points. The four supporting points 22 are illustrated as being outside of the mask, to clarify the locations of these points, but are actually located beneath the mask. A plurality of contour lines are illustrated on the mask 20, to depict the elastically deformed surface. Twenty-five points (marked +), for example, are plotted on the surface, with individual relative levels in height given in μm. These were measured from a center level of 0.0 μm, where each side of the square surface is about 130 mm in length. Thus, each two adjacent contour lines exhibit a different level, by about 1 μm.

Figure 4:
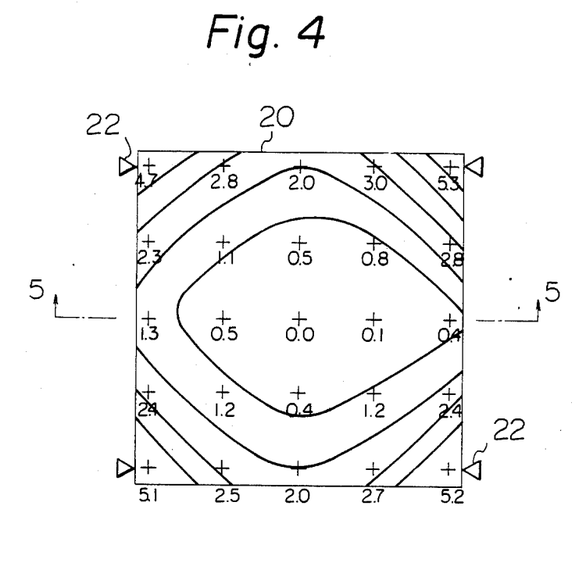
FIG. 4 is a plan view of the blank mask to be patterned when supported at four points, showing contour lines and levels obtained by a technique different from that used in obtaining the data in FIG. 3.

FIG. 4 is a plan view of the blank mask to be patterned when supported at four points, showing contour lines and levels obtained by the same technique used in obtaining the data in FIG. 3. That is, the contour lines and levels shown in FIG. 4 are in reference to an ideal plane. The ideal plane can be defined by utilizing a well known least square approximation method. Those skilled in the art will understand that such an ideal plane will lie in a plane which is normal to the z-axis, and that for any position of the ideal plane with respect to the z-axis, the relative level data of the level map does not vary. Accordingly, the ideal plane is first defined and then shifted in the direction of the z-axis so that it intersects the center of the mask. By using such an ideal plane, the pitch error can be corrected with a high accuracy; as any deviation in the level of the surface of the mask itself can be measured. Thus, the pitch error correction according to the present invention is preferably achieved in reference to this ideal plane.

According to the example shown in FIG. 4, the maximum deviation in level reaches about 5 μm, when the mask is 130 mm square.

Figure 5:
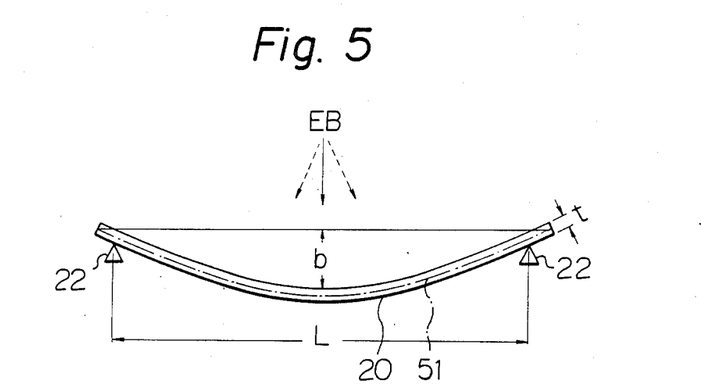
FIG. 5 is a cross-section view of the mask taken along the line 5—5 shown in FIG. 4.
Figure 6:
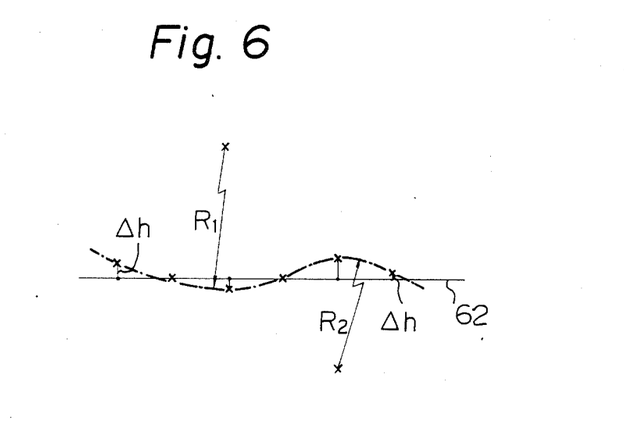
FIG. 6 depicts an arbitrary profile of the mask.

FIG. 5 is a cross-section view of the mask taken along the line 5—5 shown in FIG. 4. The members 20 and 22 are identical to those shown in the previous figures. Reference numeral 51 denotes a neutral axis of the elastically deformed mask 20. FIG. 5 clearly shows one basic mode of the elastic deformation which apparently produces the deflection by compression on the surface to be patterned by the EB. In this case, it should be noted that, on the surface of the mask, not only the deflection by compression, as illustrated in FIG. 5, but also the deflection by tension may be produced, as illustrated in FIGS. 2 and 6. In the basic mode of elastic deformation shown in FIG. 5, the following equation (1) stands approximately.

$$\Delta L = 4bt/L \tag{1}$$

Where, $\Delta L$ denotes the compression amount produced on the surface of the mask ($\Delta L$ also denotes the tension amount produced thereon where deflection by tension exists thereon), L denotes the span of one arc due to the deformation (in FIG. 5, L denotes a span between two supporting points 22), t denotes a thickness of the mask 20, and b denotes a bending amount, i.e., the largest amount of displacement of the center of each curve or arc in the mask with respect to the portion of the mask in the same curve. The equation (1) is taught by, for example, the disclosure on pages 86 and 87 of a "Proceeding of Interface '74, Kodak Microelectronics Seminar, H. R. Rottmann, entitled "Advances in Contact and Proximity Printing." According to equation (1), a compression amount $\Delta L$ of about 0.38 μm is obtained when the parameter L is about 120 mm, b about 5 μm, and t about 2.3 mm. This compression amount (or tension amount) $\Delta L$ will induce pitch errors in the pattern to be produced, if the mask 20 is placed on and is in contact with, via its resist coated surface, a wafer, because, at this time, elastic deformation is not created in the mask 20.

FIG. 6 depicts an arbitrary profile of the mask. The chain dotted line 61 indicates the profile of the mask, and the straight line 62 represents the least square approximated plane defined as the aforesaid ideal plane. In FIG. 6, the arc $R_1$ is similar to the arc shown in FIG. 5. The arc $R_1$ is produced by the deformation due to compression. Conversely, the arc $R_2$ is produced by the deformation due to tension.

A radius Rf which is a representative of $R_1$ and $R_2$, is an approximation of the radius of the bending curvature (refer to FIG. 5), corresponding to said arc, of the mask surface. The radius R can be derived from the equation (1). The correction data for compensating the pitch error can be obtained in the manner mentioned hereinafter.

According to a preferred embodiment of the present invention, the elastic deformation of the mask is first forcibly concentrated in either one of the X and Y directions. That is, the supporting points 22 are arranged so the plate exhibits deformation along one direction only.

Figure 7:
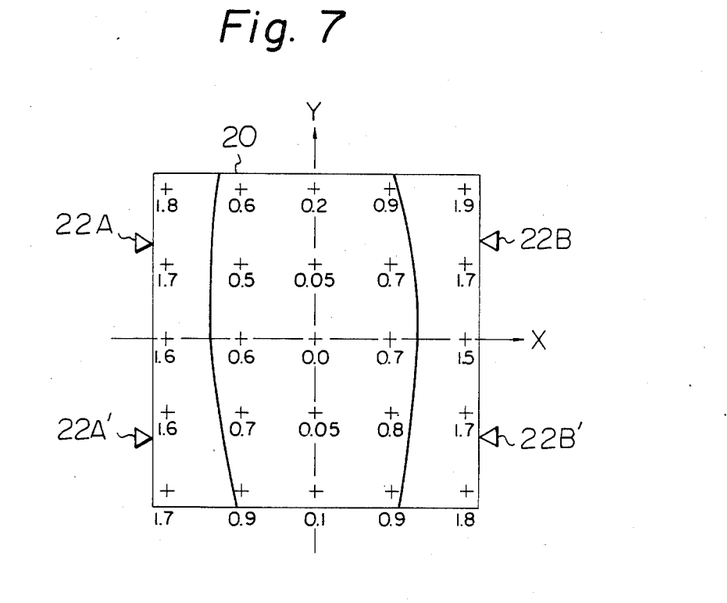
FIG. 7 shows a preferred arrangement of the supporting points, according to the present invention.

FIG. 7 shows a preferred arrangement of the supporting points, according to the present invention. In the preferred embodiment, the processing for effecting the correction of the pitch error can be limited to one direction only of the two perpendicular directions. In the embodiment shown in FIG. 7, the supporting points 22A, 22A', 22B, and 22B' are arranged in such a manner as to suppress the deviation in level, along the Y direction, to within about 0.5 μm. This may also be clarified with reference to the contour lines which are nearly parallel with the Y direction. For example, assuming that the mask 20 is 130 mm square and about 2.3 mm in thickness, the supporting points 22A, 22A' are located with a pitch of about 80 mm, and the supporting points 22B, 22B' are also located with the same pitch. In this case, as shown by the above equation (1), the pitch error in the Y direction is suppressed and made smaller than 0.04 μm. In FIG. 7, numerals at respective plots marked + indicate levels in height, i.e., level differences, relative to the reference level defined by the aforesaid least square approximated plane, the ideal plane.

Conversely, in the elastic deformation in the X direction, shown in FIG. 7, a deformation by compression is exhibited to provide a level difference of about 2 μm. In these circumstances, it may be thought possible to adjust each location of the supporting point pairs 22A, 22B and 22A', 22B' in not only the Y direction (as mentioned above) but in also the X direction, to suppress the deviation in level in both the X and Y directions, and thereby minimizing the elastic deformation over the entire surface of the mask 20. However, in practice, it is impossible to make the entire surface flat, and this method only results in giving the plate a ball-like shape; as proved by experiment.

If the mask 20 is set with the physical conditions shown in FIG. 7 and then rendered to the EB exposure process, the resultant pattern accuracy will be deteriorated by a pitch error of about 0.15 μm, when the mask 20 is laid flat on the wafer surface. The value of 0.15 μm can also be estimated by using the previously recited equation (1). This poor accuracy can be improved by the present invention.

Taking the mask 20 shown in FIG. 7 as an example, the present invention is preferably put into practice as described below. As shown in FIG. 7, deviation in the level of the mask surface varies smoothly and monotonously in one direction, i.e., the X direction. Therefore, the concerned pitch error correction can be effected by assuming that the pitch error, i.e., the compression amounts defined by the equation (1), is distributed with individual amounts which are proportional to the respective distances from the center (refer to 0.0 in FIG. 7) of the mask surface. Specifically, if a specified intended location x is modified by a corrected location x', the desired pattern can be reproduced correctly on the wafer surface as intended, even though the patterned mask is flattened thereon. The relationship between x and x' can be approximately expressed by the following equation (2).

$$x' = x - \frac{1}{2} \cdot \frac{4bt}{L} \cdot \frac{2}{L} x \tag{2}$$

In the equation (2), the second term $$\text{``}\frac{1}{2} \cdot \frac{4bt}{L} \cdot \frac{2}{L} x\text{''}$$

exists as a correction value derived from the equation (1). In the EB exposure system, this correction value is applied, as correction data, to a predetermined pattern data to expose an intended pattern on the surface of the workpiece.

The pitch error correction according to the present invention can also be applied to a workpiece, for example, the mask 20 elastically deformed with the ball-like shape shown in FIG. 4, without adjusting the locations of the supporting points 20, as is done in FIG. 7. That is, the present invention can be generally practiced as follows.

Figure 8A:
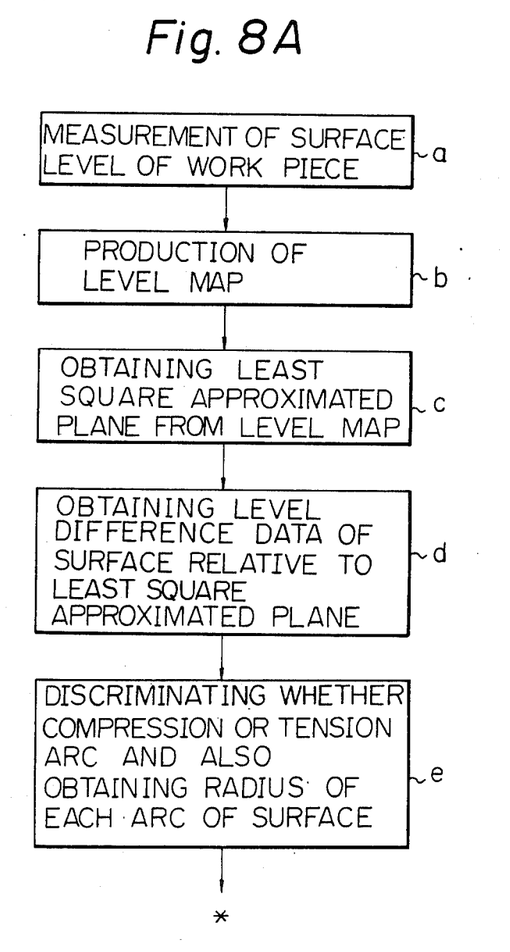
FIGS. 8A and 8B are flow charts of successive processing steps for achieving the pitch error correction according to a first embodiment of the present invention.
Figure 8B:
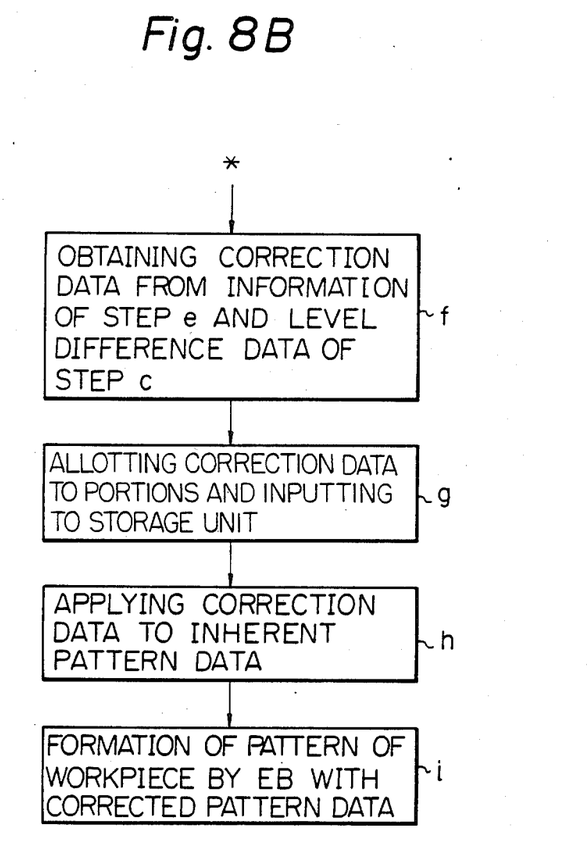

FIGS. 8A and 8B are flow charts of successive processing steps for achieving the pitch error correction according to a first embodiment of the present invention.

In step a, the surface level of the workpiece, for example, the mask 20, is measured by a known measurement technique using a laser, an electrostatic microgauge, an air microgauge, or by interference fringes.

In step b, the surface level data is measured at a plurality of specified portions along both X and Y axes (refer to each symbol + in FIG. 4) and then a level map is produced based on the thus measured surface level data.

In step c, the least square approximated plane is defined with respect to the level map obtained in step b.

In step d, the level difference data Δh (refer to FIG. 6) of the surface level relative to the least square approximated plane is obtained at each of the specified portions.

In step e, the thus obtained level difference data is used to determine whether each specified portion exhibits a compression arc or a tension arc corresponding to the arc defined by the radius $R_1$ or $R_2$ in FIG. 6, respectively. Also, the radius of each arc is obtained. Here, the radius can be estimated by assuming that the arc is a part of an actual circle. The actual circle can be determined from the level difference data.

In step f, the correction data is obtained based on the data regarding the level differences.

In step g, the correction data is stored in the corresponding addresses in the memory areas of the storage unit. In this case, the addresses may be allotted to individual portions arranged with a pitch of, for example, 5 mm, on the surface of the workpiece, in relation to the level map.

In step h, the inherent pattern data is corrected by applying thereto the corresponding correction data read from the storage unit every time the related portion on the workpiece is exposed by the EB.

In step i, the pattern is reproduced on the flat surface of the workpiece correctly and as intended, even though the mask 20 suffered from deleterious elastic deformation.

Note the above explanations refer to the mask as the workpiece; however, the workpiece can be another material, such as a wafer. In this case, as is known, the greater the thickness of the workpiece, the larger the amount of compression and tension. Therefore, the greater the thickness, the more remarkable are the advantages of the present invention. Usually, the thickness of the wafer is about 0.5 mm, while the thickness of the mask is about 2.3 mm. Thus, the pitch error correction by the present invention is useful to a great extent for a thick workpiece, such as a mask.

Figure 9:
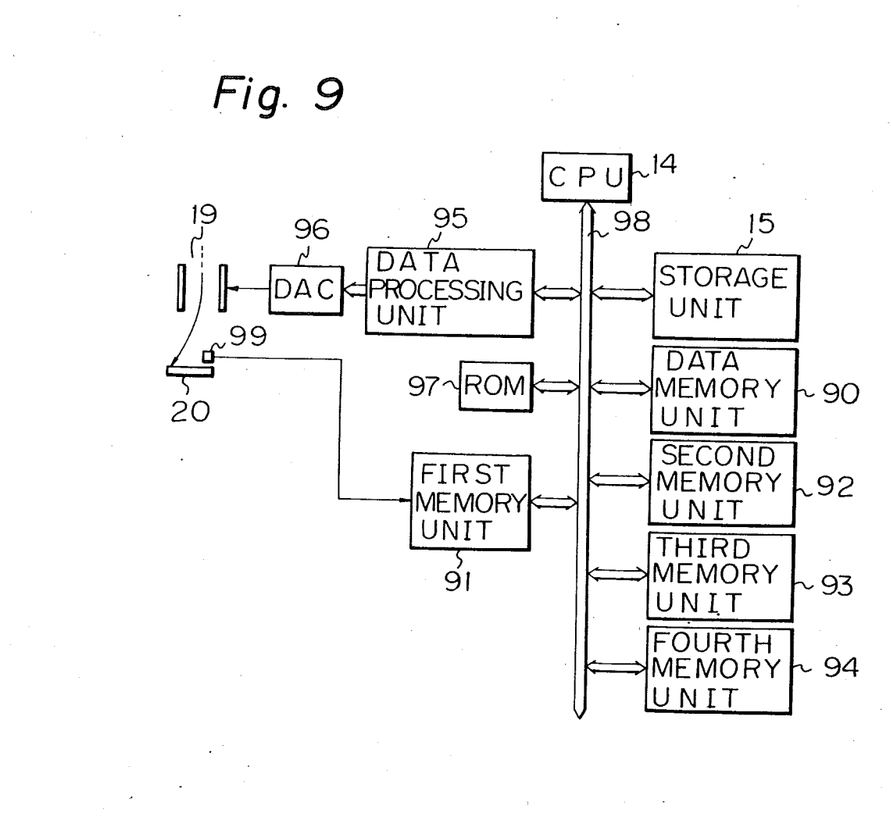
FIG. 9 is a block diagram exemplifying an electron beam exposure apparatus to be operated under the exposure method according to the present invention.

FIG. 9 is a block exemplifying an electron beam exposure apparatus to be operated under the exposure method according to the present invention. In FIG. 9, the CPU 14, the storage unit 15, and the deflection unit 19 are functionally the same as those elements shown in FIG. 1. For members 90 through 97, members 90 through 94 are particularly relevant to the present invention. The remaining members, i.e., the high speed data processing unit 95, the digital/analog converter (DAC) 96, the read only memory (ROM) 97, and the data bus 98, are as used in a conventional automated exposure apparatus as illustrated in, for example, U.S. Pat. No. 4,147,937, Fred K. Buelow et al, assigned to Fujitsu Limited. The processing unit 95 and the DAC 96 comprise an interface. The storage unit 15, e.g., a disc memory unit, contains a large variety of predetermined pattern data. The pattern data desired is transferred to a data memory unit 90. This unit 90 momentarily stores the aforesaid inherent pattern data. In the prior art, the pattern data in the unit 15 is directly transferred to the data processing unit 95. In the present invention, however, the pattern data stored in the unit 90 is first modified by the first through fourth memory units 91 through 94, and this modified pattern data is then supplied, instead of the conventional unmodified pattern data, to the processing unit 95. A measuring device 99, which is movably positioned above the workpiece, measures the surface level of the workpiece 20 as previously mentioned, and supplies the level data to the first memory unit 91, where the data is stored. The level data is processed by the CPU 14 in accordance with a newly employed program stored in the ROM 97 (refer to steps a and b). The CPU 14 reads the data in the first memory unit 91 and produces the least square approximated plane data in accordance with a corresponding program in the ROM 97. The plane data, i.e., the ideal plane data, is stored in the second memory unit 92 (refer to step c). The CPU 14 reads the data in the first and second memory units 91 and 92 and produces the level differences in accordance with a corresponding program in the ROM 97. The level difference data is stored in the third memory unit 93 (refer to step d). The CPU 14 then processes the data in the memory units 92 and 93 to obtain the correction data, through steps e and f, in accordance with a corresponding program in the ROM 97. The correction data is stored in the fourth memory unit 94 (refer to step g). Thereafter, the CPU 14 synthesizes the inherent data from the unit 90 with the corresponding correction data from the unit 94, and produces the resultant corrected pattern data to be applied to the data processing unit 95.

Figure 10:
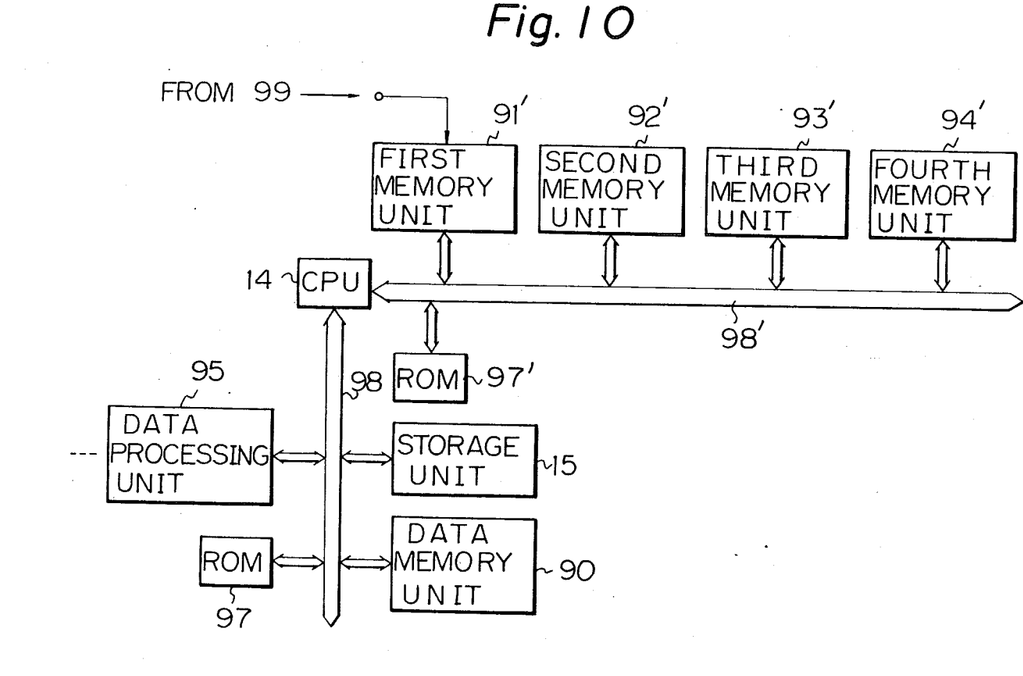
FIG. 10 illustrates a partial modification of the apparatus shown in FIG. 9.

FIG. 10 illustrates a partial modification of the apparatus shown in FIG. 9. In the modified apparatus, the data memory unit 90 does not store the original pattern data from the storage unit 15, as in the apparatus shown in FIG. 9, but stores the corrected pattern data. To accomplish this, the CPU 14 first operates to produce the corrected pattern in another field including members 91' through 94', 97', and 98', all functionally identical to the members 91 through 94, 97 and 98 shown in FIG. 9, respectively. Further, if a chip size in the wafer is less than 10 mm, it may not be necessary to apply the aforesaid pattern data correction to individual chips, but may be sufficient to apply the same data to the pitch size between each two adjacent chips.

Note, the pattern data correction of the present invention can be utilized in another field, such as a photo beam exposure system. In addition, it can be utilized in forecasting the actual pattern of a certain object, merely measuring the surface level of that object.

As mentioned above in detail, the present invention can suppress to a great extent, the pitch error, due to the elastic deformation, produced in a pattern to be exposed. Therefore, the present invention is suitable for reproducing extremely precise and high density patterns, such as for VLSI's.

We claim:

1. An electron beam exposure method for forming a pattern on a workpiece mounted on supporting points, comprising the steps of:
   (a) obtaining level data of a surface of said workpiece when said workpiece is subjected to an elastic deformation;
   (b) applying correction data to a predetermined pattern data according to which said pattern is formed; and
   (c) exposing said elastically deformed workpiece with an electron beam in accordance with the corrected pattern data, so that said pattern is formed on said workpiece when said workpiece is not deformed.

2. A method as set forth in claim 1, wherein step (a) further comprises obtaining the level data at a plurality of selected portions on the surface of the workpiece so as to obtain a level map with a level measuring means movably positioned above said workpiece.

3. A method as set forth in claim 2, wherein the level data in said level map is processed in the form of a level difference between each selected portion of the surface of said workpiece and a ideal plane which intersects the center portion of the surface of said workpiece.

4. A method as set forth in claim 3, wherein said ideal plane is defined by a least square approximation method in such a manner that the ideal plane intersects the center portion of said workpiece.

5. A method as set forth in claim 4, wherein step (b) further comprises obtaining a compression amount and a tension amount at each selected portion of the surface of said workpiece so as to produce said correction data based on an analysis of a "bridge"-like lever.

6. A method as set forth in claim 5, wherein the profile of each "bridge"-like lever is approximated by individual radii.

7. A method as set forth in claim 6, wherein said correction data is obtained by using said level difference data to determine said approximated radii.

8. A method as set forth in claim 7, wherein step (c) includes exposing said pattern with said pattern data combined with said correction data.

9. A method as set forth in claim 8, wherein said step (a) includes first adjusting each location of said supporting points to maintain the surface of said workpiece substantially straight in either the X direction or the Y direction only, and second, obtaining said level data along the surface regarding the other direction only.

10. An electron beam exposure apparatus for forming a pattern on a workpiece mounted on supporting points, comprising:

an exposure assembly, the exposure assembly including a deflection unit; and a processor, operatively connected to said exposure assembly, for controlling the direction of the electron beam with said deflection unit, said processor comprising— a central processing unit, an interface operatively connected to said central processing unit, a storage unit operatively connected to said central processing unit, and data buses operatively interconnected to said central processing unit, said interface, and said storage unit, and said storage unit includes first through fourth memory units, the first memory unit storing first data indicating level data on the surface of said workpiece, the second memory unit storing second data which is data processed by said central processing unit to indicate an ideal plane intersecting the center of the surface to be patterned, the third memory unit storing third data which is data processed by said central processing unit to indicate level differences between each approximated level of said surface and the level of the ideal plane, and the fourth memory unit storing fourth data which is data processed by said central processing unit to indicate correction data to be applied to a predetermined pattern data for forming said pattern on said workpiece.

* * * * *

UNITED STATES PATENT AND TRADEMARK OFFICE
CERTIFICATE OF CORRECTION

PATENT NO. :   4,678,919

DATED      :   July 7, 1987

INVENTOR(S) :  SUGISHIMA ET AL.

It is certified that error appears in the above-identified patent and that said Letters Patent is hereby corrected as shown below:

On the title page:

[73] "Kanagawa" should be --Kawasaki--

Column 1, line 24 "0.2"$\mu$m" should be --0.5$\mu$m--

Column 8, line 2, "tthrough" should be --through--.

Signed and Sealed this

Thirtieth Day of August, 1988

Attest:

DONALD J. QUIGG

*Attesting Officer*  *Commissioner of Patents and Trademarks*